(12) United States Patent
Im et al.

(10) Patent No.: US 9,231,169 B2
(45) Date of Patent: Jan. 5, 2016

(54) HIGH EFFICIENCY LIGHT EMITTING DIODE

(71) Applicant: SEOUL VIOSYS CO., LTD., Ansan-si (KR)

(72) Inventors: Chang Ik Im, Ansan-si (KR); Mi Hee Lee, Ansan-si (KR); Ju Yong Park, Ansan-si (KR); Sung Su Son, Ansan-si (KR); Chang Yeon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 79 days.

(21) Appl. No.: 14/132,123

(22) Filed: Dec. 18, 2013

(65) Prior Publication Data

US 2014/0166976 A1 Jun. 19, 2014

(30) Foreign Application Priority Data

Dec. 18, 2012 (KR) .................. 10-2012-0148361

(51) Int. Cl.
| | |
|---|---|
| H01L 29/06 | (2006.01) |
| H01L 31/00 | (2006.01) |
| H01L 33/50 | (2010.01) |
| H01L 33/04 | (2010.01) |
| H01L 33/40 | (2010.01) |
| H01L 33/38 | (2010.01) |

(52) U.S. Cl.
CPC .............. *H01L 33/502* (2013.01); *H01L 33/04* (2013.01); *H01L 33/40* (2013.01); *H01L 33/38* (2013.01); *H01L 2933/0083* (2013.01)

(58) Field of Classification Search
CPC ....... H01L 33/04; H01L 33/502; H01L 33/38; H01L 2933/0083
USPC ........................................... 257/98
See application file for complete search history.

(56) References Cited

U.S. PATENT DOCUMENTS

| | | | |
|---|---|---|---|
| 2008/0197369 A1* | 8/2008 | Batres et al. .................... 257/98 |
| 2012/0132930 A1* | 5/2012 | Young et al. .................... 257/84 |
| 2013/0052463 A1* | 2/2013 | Shelton et al. ................ 428/402 |
| 2013/0193408 A1* | 8/2013 | Hwang et al. .................. 257/13 |
| 2015/0116721 A1* | 4/2015 | Kats et al. .................... 356/454 |

FOREIGN PATENT DOCUMENTS

WO 2011/053037 5/2011

* cited by examiner

*Primary Examiner* — Zandra Smith
*Assistant Examiner* — John M Parker
(74) *Attorney, Agent, or Firm* — H.C. Park & Associates, PLC

(57) ABSTRACT

Exemplary embodiments of the present invention provide a high efficiency light emitting diode including a semiconductor stack including a first-type compound semiconductor layer, an active layer, and a second-type compound semiconductor layer, a first electrode disposed on the semiconductor stack, and a graphene-metamaterial laminate structure disposed between the first electrode and the semiconductor stack.

16 Claims, 2 Drawing Sheets

HIGH EFFICIENCY LIGHT EMITTING DIODE

CROSS-REFERENCE TO RELATED APPLICATION

This application claims priority from and the benefit of Korean Patent Application No. 10-2012-0148361, filed on Dec. 18, 2012, which is hereby incorporated by reference for all purposes as if fully set forth herein.

BACKGROUND

1. Field

Exemplary embodiments of the present invention relate to a light emitting diode and, more particularly, to a high efficiency GaN-based light emitting diode capable of preventing optical loss due to electrodes using a metamaterial.

2. Discussion of the Background

Generally, group-III nitrides, such as gallium nitride (GaN), aluminum nitride (AlN), and the like, have attracted attention as materials for light emitting diodes capable of emitting light in the visible and ultraviolet ranges due to excellent thermal stability and direct energy band gap. In particular, blue and green light emitting diodes using indium gallium nitride (InGaN) have been used in a wide range of fields, such as large color flat panel displays, signal lights, indoor lighting, high density light sources, high resolution output systems, optical communications, and the like.

Since it may be difficult to produce a homogeneous substrate capable of growing group-III nitride semiconductor layers, group-III nitride semiconductor layers may be grown on a heterogeneous substrate having a similar crystal structure through metal-organic chemical vapor deposition (MOCVD) or molecular beam epitaxy (MBE). A sapphire substrate having a hexagonal crystal structure may be used as a heterogeneous substrate. However, sapphire is an electrically non-conductive material, which may limit the structure of the light emitting diode. Accordingly, technology for fabricating a vertical-type high efficiency light emitting diode has been developed. In this technology, after epitaxial layers such as nitride semiconductor layers are grown on a heterogeneous substrate such as a sapphire substrate, a support substrate is bonded to the epitaxial layers, followed by separation of the heterogeneous substrate by laser lift-off or the like.

A metal substrate may be used as the support substrate in the vertical-type light emitting diode, thereby providing an excellent current spreading function in a vertical direction. In addition, after separation of the growth substrate, a roughened surface may be formed on an exposed N-plane of the gallium nitride layer through etching such as PEC, thereby providing excellent luminous efficacy.

However, since a vertical-type light emitting diode may include an N-electrode disposed on a light emitting surface, there may be a problem of optical loss due to the N-electrode absorbing or reflecting light generated in the light emitting diode, and preventing the light from being emitted to an outside of the light emitting diode. Although it may be necessary to reduce the area of the N-electrode in order to increase the area of the optical emitting surface, effective reduction in area of the N-electrode may be limited due to adhesive strength or current spreading requirements.

To solve such problems, a reflective metal layer may be disposed under the N-electrode to reflect light entering the N-electrode. However, as the reflected light is emitted to outside after passing through the epitaxial layers, there may be significant loss of light through the epitaxial layers.

SUMMARY OF THE INVENTION

Exemplary embodiments of the present invention provide a light emitting diode capable of preventing optical loss due to absorption of light by an electrode material.

Exemplary embodiments of the present invention also provide a light emitting diode capable of emitting light, which has entered an electrode, to outside instead of reflecting the light into an epitaxial layer.

Additional features of the invention will be set forth in the description which follows, and in part will be apparent from the description, or may be learned by practice of the invention.

An exemplary embodiment of the present invention discloses a light emitting diode including a semiconductor stack including a first-type compound semiconductor layer, an active layer, and a second-type compound semiconductor layer, a first electrode disposed on the semiconductor stack, and a graphene-metamaterial laminate structure disposed between the first electrode and the semiconductor stack.

An exemplary embodiment of the present invention also discloses a light emitting diode including a semiconductor stack including a first-type compound semiconductor layer, an active layer, and a second-type compound semiconductor layer, a first electrode disposed on the semiconductor stack, and a metamaterial disposed between the first electrode and the semiconductor stack.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
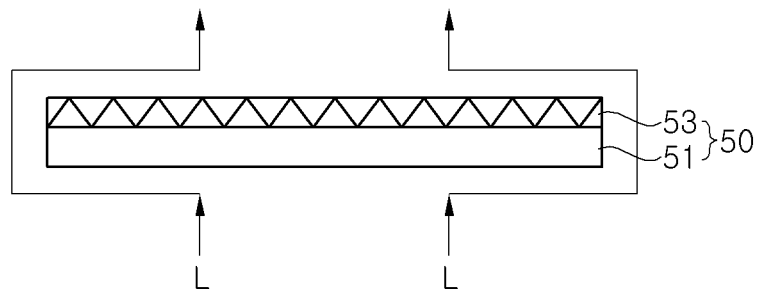
FIG. 1 is a schematic view illustrating light transmission characteristics of a graphene-metamaterial structure.

Exemplary embodiments of the present invention will be described in more detail with reference to the accompanying drawings. It should be understood that the following exemplary embodiments are given by way of illustration only to provide thorough understanding of the invention to those skilled in the art. Therefore, the present invention is not limited to the following exemplary embodiments and may be embodied in different ways. Further, like components will be denoted by like reference numerals throughout the specification, and the widths, lengths, and thicknesses of certain elements, layers or features may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIG. 1 is a schematic view illustrating light transmission characteristics of a graphene-metamaterial structure 50.

A metamaterial 53 has a negative index of refraction and is artificially produced. When light L is incident upon the metamaterial 53, the light L travels along a surface of the metamaterial 53 to be emitted to outside through an opposite side of the metamaterial 53.

The metamaterial 53 may be formed of gold (Au) and a dielectric material in a pattern having a smaller size than wavelengths of light incident to the metamaterial 53. The metamaterial 53 may be formed by periodically arranging gold in a pattern of 0.5 nm to 10 nm, interspersed with dielectric material. For example, the metamaterial 53 may be formed of Au in a honeycomb shape. Thus, gold islands are surrounded by dielectric material to form the metamaterial 53. The islands are configured to be arranged in a pattern smaller than the wavelength of light incident thereto, allowing the light to travel in the path L shown in FIG. 1, rather than being absorbed or reflected.

In particular, the graphene-metamaterial laminate structure 50 is formed by stacking the metamaterial 53 on graphene 51, or vice versa, and exhibits good transmission characteristics with respect to visible light. Graphene has a periodic (hexagonal lattice) single atom carbon layer. Graphene is flexible and has durability and electron mobility higher than metal. The graphene-metamaterial laminate structure 50 may have a thickness of about 1 nm or less.

Figure 2:
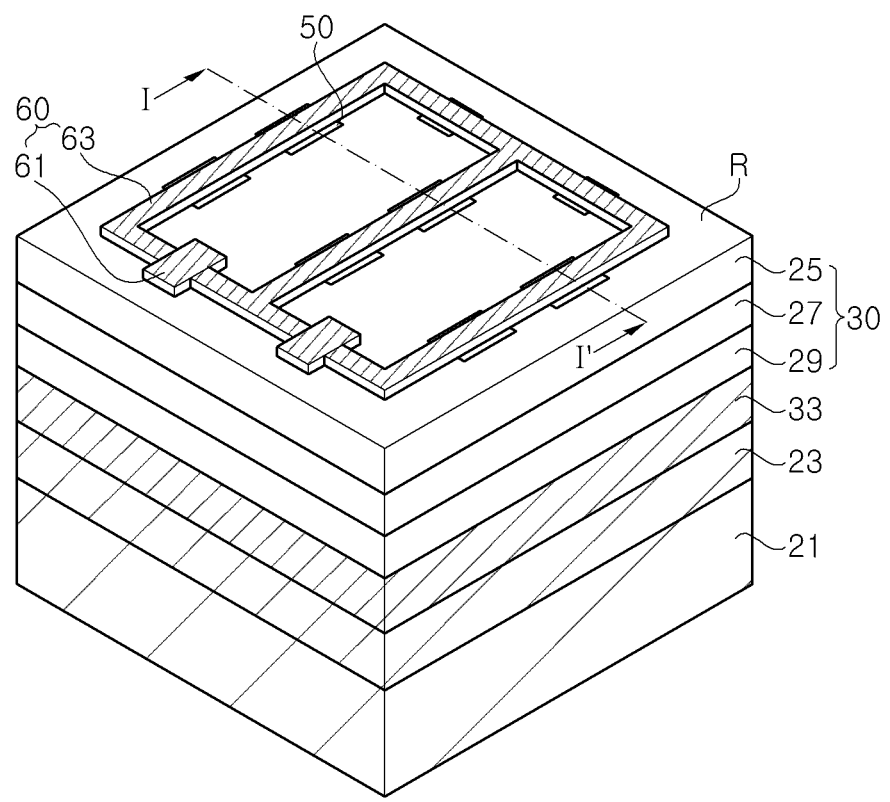
FIG. 2 is a perspective view of a light emitting diode in accordance with an exemplary embodiment of the present invention.
Figure 3:
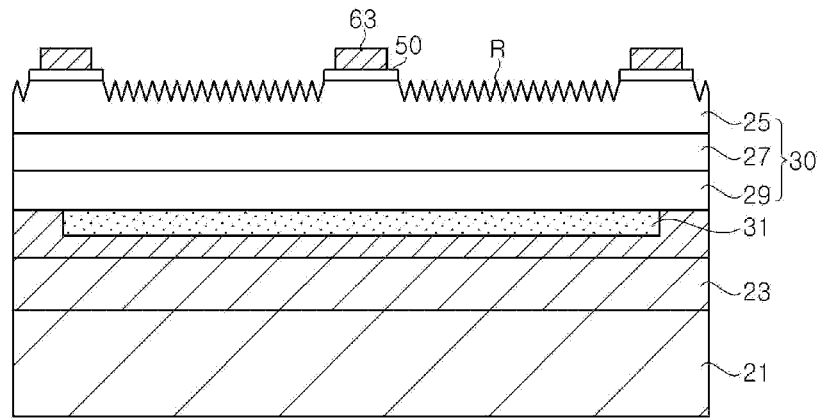
FIG. 3 is a sectional view of the light emitting diode in accordance with the exemplary embodiment shown in FIG. 2, taken alone line I-I'.

FIG. 2 and FIG. 3 are a perspective view of a light emitting diode in accordance with an exemplary embodiment of the present invention, and a sectional view of the exemplary embodiment taken along line I-I' of FIG. 2.

Referring to FIG. 2 and FIG. 3, the light emitting diode includes a support substrate 21, a bonding metal layer 23, a reflective metal layer 31, a barrier metal layer 33, a semiconductor stack 30, a first electrode 60, and a graphene-metamaterial laminate structure 50.

The support substrate 21 is distinguished from a growth substrate for growing compound semiconductor layers, and is a secondary substrate attached to the compound semiconductor layers grown on the growth substrate. The support substrate 21 may be a sapphire substrate, without being limited thereto. Alternatively, the support substrate 21 may be a substrate formed of other kinds of insulating or conductive materials. The support substrate 21 may be a metal substrate and may function as a second electrode.

The bonding metal layer 23 is disposed between the support substrate 21 and the barrier metal layer 33 to couple the semiconductor stack 30 to the support substrate 21. The bonding metal layer 23 may be formed of, for example, Au—Sn through eutectic bonding.

The semiconductor stack 30 is disposed on the support substrate 21, and includes a p-type compound semiconductor layer 29, an active layer 27 and an n-type compound semiconductor layer 25. Here, the semiconductor stack 30 has the p-type compound semiconductor layer 29 disposed nearer the support substrate 21 than the n-type compound semiconductor layer 25.

The n-type compound semiconductor layer 25, active layer 27, and p-type compound semiconductor layer 29 may be formed of a Group III-N based compound semiconductor, for example, (Al, Ga, In)N semiconductors. Each of the n-type compound semiconductor layer 25 and the p-type compound semiconductor layer 29 may be formed in a single layer or multiple layers. For example, the n-type compound semiconductor layer 25 and/or the p-type compound semiconductor layer 29 may include a contact layer and a clad layer, and may include super-lattice layers. Further, the active layer 27 may have a single quantum well structure or a multi-quantum well structure. Since the n-type compound semiconductor layer 25 having relatively low resistance is disposed at an opposite side of the semiconductor stack 30 from the support substrate 21, a roughened surface R may be formed on an upper side of the n-type compound semiconductor layer 25. Here, the roughened surface R enhances efficiency of extracting light generated in the active layer 27.

The reflective metal layer 31 and the barrier metal layer 33 are disposed between the p-type compound semiconductor layer 29 and the support substrate 21, and are in ohmic contact with the p-type compound semiconductor layer 29. The barrier metal layer 33 may surround the reflective metal layer 31 such that the reflective metal layer 31 is embedded between the semiconductor stack 30 and the support substrate 21. The reflective metal layer 31 may be formed of a reflective material, for example, Ag, and the barrier metal layer 33 may include, for example, Ni.

The first electrode 60 is arranged on the semiconductor stack 30 and is electrically connected to the n-type compound semiconductor layer 25. The first electrode 60 may include an electrode pad 61 and an extended portion 63 extending from the electrode pad 61. The electrode pad 61 is formed for wire bonding, and the extended portion 63 is formed to allow electric current to be evenly spread over a wide area. The first electrode 60 may have a variety of shapes, and FIG. 2 illustrates one example of the first electrode 60.

The graphene-metamaterial laminate structure 50 may be disposed between the first electrode 60 and the semiconductor stack 30. As described with reference to FIG. 1, the graphene-metamaterial laminate structure 50 has a laminate structure of the graphene 51 and the metamaterial 53. The graphene-metamaterial laminate structure 50 may be disposed in ohmic contact with the n-type compound semiconductor layer 25. Although not shown, a transparent electrode layer for ohmic contact may be disposed between the graphene-metamaterial laminate structure 50 and the semiconductor stack, as needed.

An anodizing technique may be used to form the metamaterial 53 on the semiconductor stack 30. A thin metal layer is deposited on the semiconductor stack 30, then thermal annealing is used for metal aggregation. This causes the metal to form islands as described above. A solution of metal and HCl, such as $HAuCl_4$, may be used to form nano-particles on the semiconductor stack 30 via a synthesizing technique. The metal in the thin metal layer may include at least one of Cu, Ag, Au, Pt, Pd, Cr, Ti, and W. Once annealing is performed, a dielectric material (such as $SiO_2$) is disposed on the annealed thin metal layer to form the metamaterial 53. The dielectric material is then etched to expose the metal on a top surface.

The metamaterial 53 may be non-periodic because of difficulties in uniformly covering the various small components of the light emitting diode. Further, the metamaterial 53 may not form in a uniform periodic pattern because gold islands formation is difficult to control on non-uniform surfaces of the light emitting diode. Thus, according to the present exemplary embodiment, graphene 51 is deposited on the metamaterial 51 to form the graphene-metamaterial laminate structure 50, thereby improving efficiency. The thickness of the graphene-metamaterial laminate structure 50 is about 10 nm to about $\lambda/4$ ($\lambda \approx 450$ nm).

As shown in FIG. 2, the graphene-metamaterial laminate structure 50 may be partially disposed between the extended portion 63 and the semiconductor stack 30. Thus, portions of the extended portion 63 may directly contact the semiconductor stack 30, in particular the n-type compound semiconductor layer 25. Alternatively, the graphene-metamaterial laminate structure 50 may be disposed on an overall area between the extended portion 63 and the semiconductor stack 30. Furthermore, although not shown in FIG. 2, the graphene-metamaterial laminate structure 50 may be disposed between the electrode pad 61 and the semiconductor stack 30.

The graphene-metamaterial laminate structure 50 may have a greater width than a portion of the electrode 60 disposed thereon. This structure reduces loss of light traveling along the surface of the graphene-metamaterial laminate structure 50 due to absorption by the first electrode 60 at the opposite side of the graphene-metamaterial laminate structure 50. The metamaterial-graphene laminate structure 50 helps avoid a light absorption area in the light emitting diode since light is guided around the electrode 60 by the metamaterial-graphene laminate structure 50.

According to the present exemplary embodiment, light traveling towards the first electrode 60 is emitted to the outside after traveling along the surface of the graphene-metamaterial laminate structure 50. As a result, it is possible to prevent optical loss due to absorption of light by the first electrode 60, while allowing the light to be emitted to the outside instead of being reflected again into the semiconductor stack 30.

Figure 4:
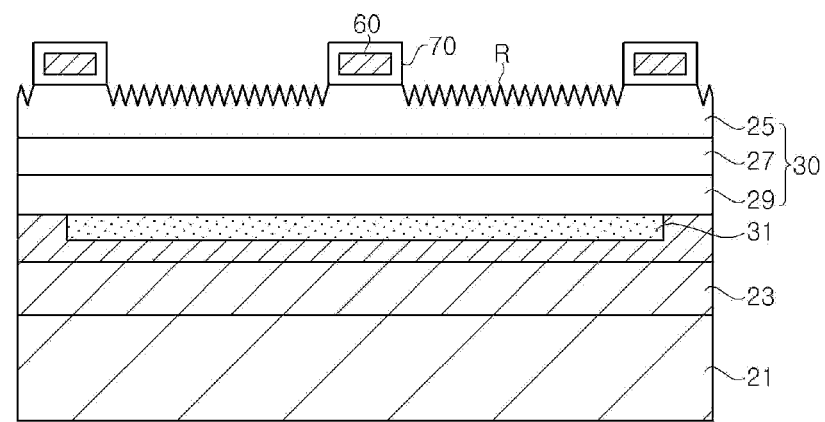
FIG. 4 is a sectional view of a light emitting diode in accordance with an exemplary embodiment of the present invention.

FIG. 4 is a sectional view of a light emitting diode in accordance with an exemplary embodiment of the present invention.

Referring to FIG. 4, the light emitting diode according to the present exemplary embodiment has a similar structure to the light emitting diode described with reference to FIG. 2 and FIG. 3, except that a graphene-metamaterial laminate structure 70 surrounds the first electrode 60.

As shown in FIG. 4, the graphene-metamaterial laminate structure 70 surrounds the first electrode 60. Like the laminate structure 50 shown in FIG. 2, the graphene-metamaterial laminate structure 70 may partially surround the extended portion 63 or may entirely surround the electrode 60.

The graphene-metamaterial laminate structure 70 includes a portion disposed between the first electrode 60 and the semiconductor stack 30, a portion covering lateral sides of the first electrode 60, and a portion covering an upper side of the first electrode 60, and these portions of the graphene-metamaterial laminate structure 70 may be formed by different processes. For example, the graphene-metamaterial laminate structure 70 may be formed to surround the first electrode 60 by forming the graphene-metamaterial laminate structure 50 as shown in FIG. 3 on the semiconductor stack 30, forming the first electrode 60 on the graphene-metamaterial laminate structure 50, and forming the graphene-metamaterial laminate structure to cover the upper and lateral sides of the first electrode 60.

According to the present exemplary embodiment, since the graphene-metamaterial laminate structure 70 surrounds the first electrode 60, the light traveling along the surface of the graphene-metamaterial laminate structure 70 is prevented from being absorbed by the first electrode 60, thereby further improving luminous efficacy.

Although the graphene-metamaterial laminate structure 70 is illustrated as surrounding the first electrode 60 in the present exemplary embodiment, the upper side of the first electrode 60 may be exposed. That is, the graphene-metamaterial laminate structure 70 may extend from a lower side of the first electrode 60 to cover only the lateral sides thereof.

Herein, although a vertical-type light emitting diode has been illustrated, the present invention is not limited thereto and may be applied to other types of light emitting diodes which include an electrode on a light emitting side.

In addition, although the graphene-metamaterial laminate structures 50, 70 have been illustrated as being disposed between the electrode 60 and the semiconductor stack 30, the graphene 51 may be omitted or other materials may be used together with the metamaterial 53 instead of the graphene 51.

Thus, according to exemplary embodiments of the present invention, a metamaterial having a negative index of refraction is disposed between an electrode and a semiconductor stack of a light emitting diode, whereby light directed towards the electrode from the semiconductor stack may be emitted to an outside of the light emitting diode. Accordingly, the light emitting diode may prevent optical loss due to absorption of light by the electrode, and may improve luminous efficacy by reducing reflection of light into the semiconductor stack.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode, comprising:
    a semiconductor stack comprising a first-type compound semiconductor layer, an active layer, and a second-type compound semiconductor layer;
    a first electrode disposed on the semiconductor stack;
    a reflective metal layer disposed below the semiconductor stack; and
    a graphene-metamaterial laminate structure that is different from the reflective metal layer, the qraphene-metamaterial laminate structure disposed between the first electrode and the semiconductor stack.

2. The light emitting diode of claim 1, wherein the graphene-metamaterial laminate structure comprises a greater width than the first electrode.

3. The light emitting diode of claim 1, wherein the graphene-metamaterial laminate structure is further disposed on a lateral side of the first electrode.

4. The light emitting diode of claim 1, wherein the graphene-metamaterial surrounds the first electrode.

5. The light emitting diode of claim 1, wherein the first electrode comprises an electrode pad and an extended portion extending from the electrode pad.

6. The light emitting diode of claim 5, wherein the graphene-metamaterial is partially disposed between the extended portion of the first electrode and the semiconductor stack.

7. The light emitting diode according to claim 1, wherein the graphene-metamaterial is disposed on the second-type compound semiconductor layer.

8. The light emitting diode of claim 7, wherein the second-type compound semiconductor layer comprises an n-type gallium nitride layer.

9. The light emitting diode of claim 1, wherein the metamaterial comprises Au or a dielectric material.

10. The light emitting diode of claim 1, wherein the metamaterial is disposed in a pattern comprising a smaller size than a wavelength of light to be emitted from the active layer.

11. The light emitting diode of claim 10, wherein the graphene-metamaterial laminate structure has a thickness of 1 nm or less.

12. The light emitting diode of claim 1, wherein the graphene-metamaterial laminate structure entirely surrounds the first electrode.

13. The light emitting diode of claim 12, wherein the graphene-metamaterial laminate structure comprises a first portion disposed between the first electrode and the semiconductor stack, a second portion covering lateral sides of the first electrode, and a third portion covering an upper side of the first electrode opposite the first portion.

14. A light emitting diode, comprising:
   a semiconductor stack comprising a first-type compound semiconductor layer, an active layer, and a second-type compound semiconductor layer;
   a first electrode disposed on the semiconductor stack;
   a reflective metal layer disposed below the semiconductor stack; and
   a metamaterial that is different from the reflective metal layer, the metamaterial disposed between the first electrode and the semiconductor stack.

15. The light emitting diode of claim 14, wherein the metamaterial comprises a dielectric material.

16. The light emitting diode of claim 15, wherein the metamaterial further comprises gold in a honeycomb shape surrounded by the dielectric material.

* * * * *